United States Patent [19]

Conrads et al.

[11] Patent Number: 5,132,541

[45] Date of Patent: Jul. 21, 1992

[54] SENSOR MATRIX

[75] Inventors: Norbert Conrads, Hauset, Belgium; Ulrich Schiebel; Herfried Wieczorek, both of Aachen, Fed. Rep. of Germany

[73] Assignee: U.S. Philips Corporation, New York, N.Y.

[21] Appl. No.: 644,712

[22] Filed: Jan. 23, 1991

[30] Foreign Application Priority Data

Jan. 27, 1990 [DE] Fed. Rep. of Germany ....... 4002429

[51] Int. Cl.$^5$ ............................ G01T 1/29; G01T 1/16; H01L 27/14
[52] U.S. Cl. ................... 250/370.01; 357/30; 357/32
[58] Field of Search .................. 250/336.2, 338.4, 349, 250/370.01, 370.12, 370.13, 336.1; 357/30 H, 30 I, 32

[56] References Cited

U.S. PATENT DOCUMENTS

| 3,946,151 | 3/1976 | Kamiyama et al. | 357/30 X |
|---|---|---|---|
| 4,032,947 | 6/1977 | Kesel et al. | 357/32 X |
| 4,258,376 | 3/1981 | Shannon | 250/338.4 X |
| 4,562,474 | 12/1985 | Nishizawa | 357/30 X |
| 4,663,535 | 5/1987 | Nakai et al. | 357/30 X |
| 4,694,316 | 9/1987 | Chabbal | 357/30 X |
| 4,794,257 | 12/1988 | Baba et al. | 250/370.01 |
| 4,794,443 | 12/1988 | Tanaka et al. | 357/30 X |
| 4,831,257 | 5/1989 | McClelland et al. | 357/30 X |
| 4,835,587 | 5/1989 | Sato et al. | 250/370.01 X |
| 4,883,967 | 11/1989 | Tsutsui et al. | 250/370.01 |
| 4,945,240 | 7/1990 | Nix et al. | 250/330 |
| 4,956,687 | 9/1990 | de Broin et al. | 357/32 X |
| 5,017,989 | 5/1991 | Street et al. | 357/30 |

FOREIGN PATENT DOCUMENTS

| 0337826 | 3/1989 | European Pat. Off. |  |
|---|---|---|---|
| 58-117478 | 7/1983 | Japan | 250/370.01 |
| 63-172462 | 7/1988 | Japan |  |

Primary Examiner—Constantine Hannaher
Assistant Examiner—Edward J. Glick
Attorney, Agent, or Firm—William Squire

[57] ABSTRACT

A sensor matrix includes light-sensitive and/or X-ray sensitive thin-film sensors (1) comprising two electrodes (2, 6) and a semiconductor layer (5) therebetween. In each sensor (1) there is a separate electrode which serves as the first electrode (2), the semiconductor layer (5) being constructed as a continuous layer which is common to all sensors (1), and which covers all first electrodes (1), the second electrodes (6) being formed, at least for groups of sensors (1), as a continuous layer (6) which covers the semiconductor layer (5) at the area of all first electrodes (2) of the sensors (1) of the relevant group and acts as a second electrode for all sensors of the relevant group.

8 Claims, 2 Drawing Sheets

SENSOR MATRIX

FIELD OF THE INVENTION

The invention relates to a sensor matrix, comprising light-sensitive and/or X-ray sensitive thin-film sensors which comprise two electrodes and a semiconductor layer provided therebetween. Of interest is commonly owned application Ser. No. 644,713 entitled "Sensor Matrix" by the present inventors and filed concurrently herewith.

BACKGROUND OF THE INVENTION

European Offenlegungsschrift 0 337 826 describes a sensor matrix in which the first electrodes of the sensors are interconnected in a first direction, for example in the row direction, the second electrodes being interconnected in a direction extending at an angle of 90° with respect to the first direction, for example in the column direction. Between the two electrodes there are several, stacked semiconductor layers. The X-ray sensitivity of this sensor matrix is achieved in that a luminescent layer is provided on the outer electrode, which luminescent layer emits light when X-rays are incident, the light producing the desired reaction in the semiconductor layers. X-rays are thus indirectly measured by means of the luminescent layer.

SUMMARY OF THE INVENTION

It is an object of the invention to provide a sensor matrix of the kind set forth which has an as simple as possible construction.

This object is achieved in accordance with the invention in that sensors are provided with separate electrodes provided as a first electrode, the semiconductor layer being formed as a continuous layer which is common to the sensors and which covers the first electrodes, the second electrode being formed as a continuous layer for at least groups of sensors, which layer covers the semiconductor layer at the area of the first electrodes of the sensors of the relevant group and acts as the second electrode for the sensors of the relevant group.

Thus, in fact each sensor element comprises a first electrode which is mechanically and electrically separated from the first electrodes of all other sensor elements and which operates only for the relevant sensor element. For each sensor in the matrix, therefore, there is provided a respective separate electrode as the first electrode, all first electrodes being adjacently arranged. These first electrodes of the sensors are covered by a semiconductor layer which is continuous for all sensors and which, therefore, is not interrupted or otherwise subdivided. The second electrodes of the sensors are also formed by a continuous layer which is simultaneously active for at least groups of sensors. For example, a common second electrode may be provided for a group of ten sensors. This electrode is then intregal for the ten sensors. In an extreme case this second electrode may be constructed as a single common electrode for all sensors of the matrix.

The described device offers the advantage of substantially simplified manufacture. The semiconductor layer and the second electrode are constructed as a respective layer which need not be structured. For the individual sensors there need only be separately provided the first electrodes and possibly a switching element for each sensor.

In an embodiment of the invention the second electrode, being constructed as a continuous layer, covers the semiconductor layer at the area of the first electrodes of all sensors of the matrix and acts as a common second electrode for all sensors of the matrix.

The described simplification of manufacture is most pronounced in this embodiment, without giving rise to functional drawbacks for the sensors.

In a further embodiment of the invention, in order to achieve X-ray sensitivity for the sensors the semiconductor layer common to all sensors is constructed to be sufficiently thick that the layer itself absorbs an adequate amount of such that no additional luminescent layer need be provided.

The described simple construction can also be realized for a sensor matrix whose sensors are to be sensitive to X-rays, in that the semiconductor layer is constructed to be sufficiently thick that the layer itself absorbs X-rays to the desired extent, thus initiating, for example a charge shift to be measured. In that case no additional luminescent layer is required.

The desired X-ray sensitivity of the semiconductor layer can be realized according to a further embodiment of the invention by means of suitably doped selenium which has a thickness of approximately 0.5 mm.

IN THE DRAWING

An embodiment in accordance with the invention will be described in detail hereinafter with reference to the drawing. Therein:

FIG. 1 shows a circuit diagram of a part of a sensor matrix comprising a second electrode which is common to all sensors of the matrix, and FIG. 2 is a plan view of a part of a matrix comprising a common second electrode for all sensors.

DESCRIPTION OF THE PREFERRED EMBODIMENT

Figure 1:
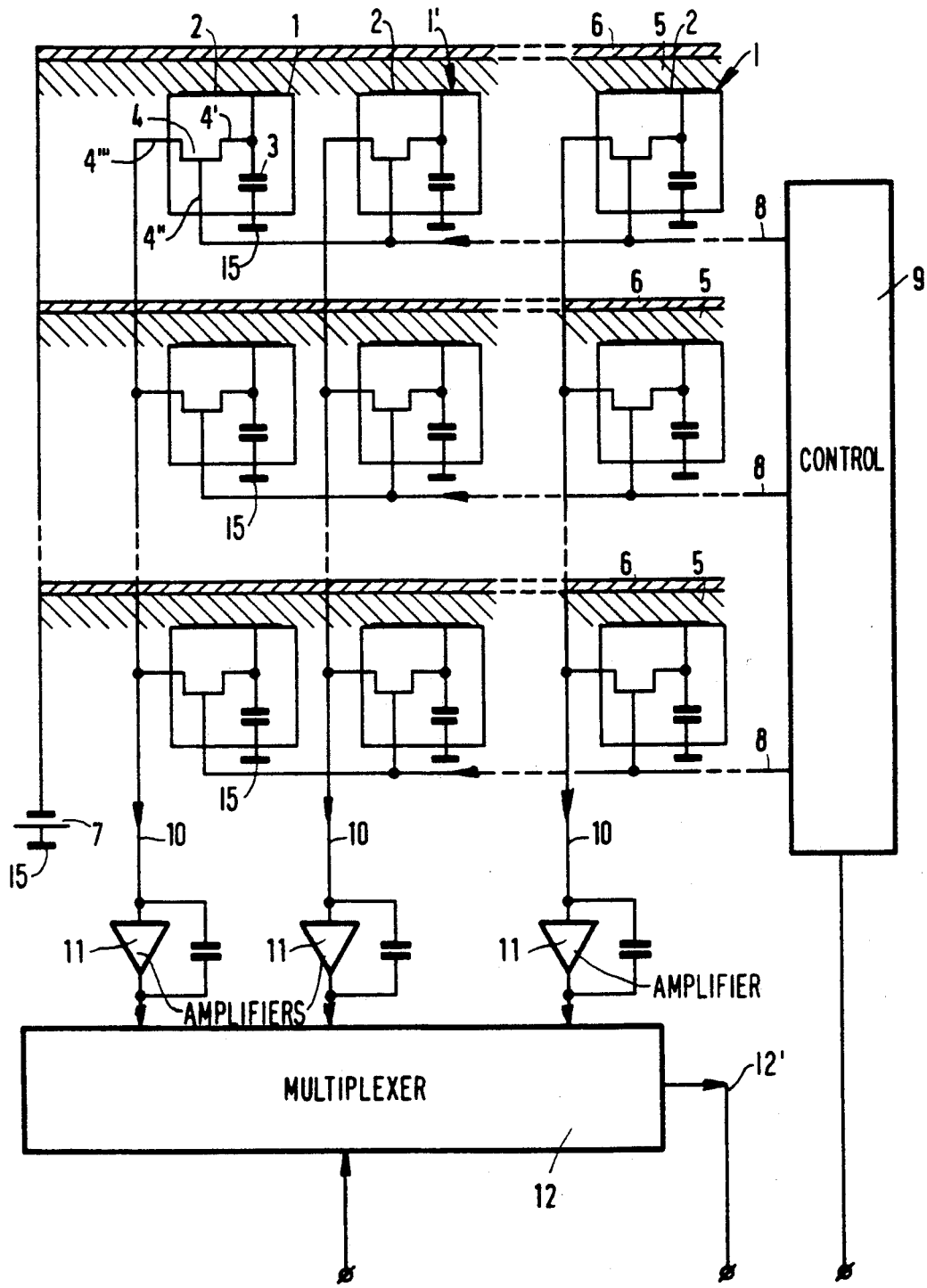

A circuit diagram of a sensor matrix as shown in FIG. 1, in which a common semiconductor layer and a common second electrode are provided for all sensor elements of the matrix, shows sensors 1 which are arranged in rows and columns of the matrix. The individual sensors 1 of the matrix have an identical construction. Each sensor 1 comprises a first electrode 2 which is provided only at the area of the relevant sensor 1 and which is mechanically and electrically separated from the first electrodes 2 of the neighboring sensors 1, for example, sensor 1. Each of the first electrodes 2 is connected to a first electrode of a storage capacitance 3 in the relevant sensor 1, the other electrode thereof being connected to ground, represented by symbols 15. The connection between the first electrode 2 and the storage capacitance 3 is connected to a source terminal 4' of a field effect transistor 4.

For example, 2000×2000 of such sensors may be provided in a sensor matrix. For the sake of clarity, however, FIG. 1 shows only three sensors per row and per column the remainder represented by the broken connecting lines.

As is diagrammatically shown in FIG. 1, all sensors of the matrix are covered by a semiconductor layer 5 which covers at least all first electrodes 2 of all sensor elements 1 of the matrix.

The semiconductor layer 5 itself is covered by an electrically conductive layer 6 which serves as the second electrode and acts as such for all sensors 1 of the matrix. The second electrode formed by layer 6 is connected to a direct voltage source 7, the other pole of which is connected to ground.

The sensor matrix shown in FIG. 1 is manufactured using the thin-film technique. This technique is used not only for the two electrodes and the semiconductor layer 5, but also for the storage capacitances 3 and the field effect transistors 4.

The common second electrode layer 6 for all sensors of the matrix is biased by way of the direct voltage source 7. When radiation such as light or X-rays are incident on the semiconductor layer 5, the radiation is absorbed by the semiconductor layer 5 whose conductivity is thus changed. Thus, a charge shift takes place which causes the storage capacitances 3 of the sensors 1 to be electrically charged. The degree of charging of each individual sensor depends on the amount of radiation incident on the semiconductor layer 5 at the area between the first electrode 2 of the relevant sensor and the counter-electrode layer 6 during a given time interval.

The charges stored in the storage capacitances 3 can be read in order to determine the incident radiation. To this end, for each row of sensors there is provided a respective switching line 8, which lines are connected to the gate terminals 4″ of the field effect transistors 4 of the sensors of the relevant row and can be controlled by means of a control circuit 9. The control circuit 9, for example can activate the switching line 8 of the first row so that all field effect transistors 4 of the sensors of this row are turned on. The charges stored in the sensors of this row are then read via a read line 10 which is provided for each sensor column and which is connected to the drain terminals 4‴ of the field effect transistors of the sensors of the relevant column. Thus, a read operation is simultaneously performed for all sensors of the relevant row. After amplification of the resultant signals in amplifiers 11, the amplified signals are applied to a multiplex circuit 12 which forms a serial output signal on line 12′ from the parallel arriving data of the sensor columns.

In order to achieve optimum clarity of the electrical switching principle, FIG. 1 shows the semiconductor layer 5 as well as the common second electrode layer 6 in a segmented form. However, in practice both the layer 5 and the common second electrode layer 6 are non-divided and cover all first electrodes 2 of all sensors 1 of the matrix.

Figure 2:
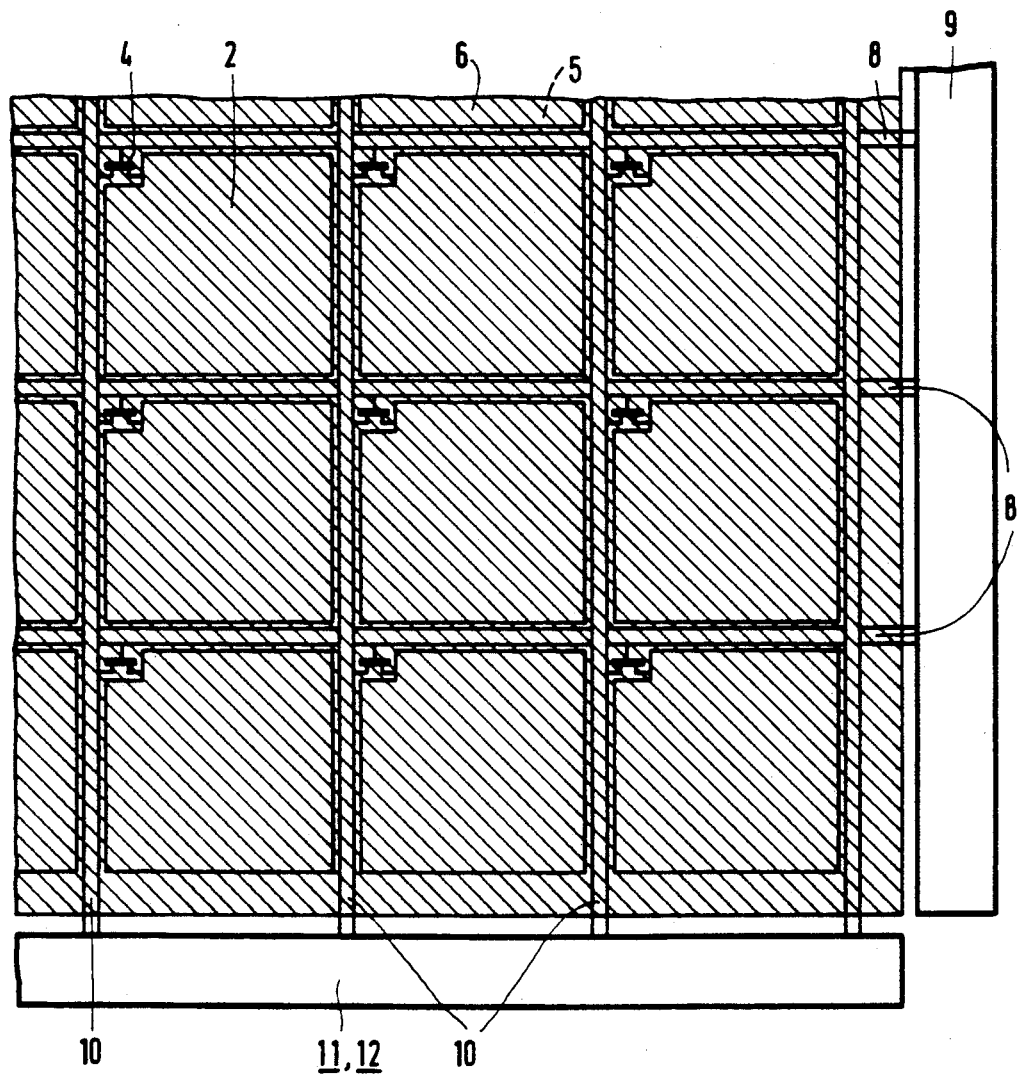

This fact is even more clearly illustrated in FIG. 2 which is a plan view of a part of a matrix in accordance with the invention. The matrix is shown in a plan view of the common second electrode layer 6. The counter-electrode layer 6 and the common semiconductor layer 5 cover all first electrodes 2 of the sensors of the matrix, only nine of which are shown by way of example in FIG. 2. Layers 5 and 6 also cover the switching lines 8 and the read lines 10 as shown in FIG. 2. In order to enable representation of the elements of the sensors situated therebelow, in FIG. 2 the second electrode layer 6 and the semiconductor layer 5 are shown only in a shaded and quasi-transparent manner.

Underneath the plane of the semiconductor layer 5 a first electrode 2 can be distinguished for each sensor in FIG. 2, which electrode occupies a comparatively large surface area. The storage capacitances 3 have been omitted in FIG. 2 for the sake of clarity. The first electrodes 2 of the sensors, therefore, are directly connected to the source terminals of the field effect transistors 4 in FIG. 2. The gate terminals of the field effect transistors 4 are connected to a respective switching line 8, the drain terminals of the field effect transistors being connected to a respective read line 10.

The device shown in FIG. 2 is constructed using the thin-film technique. This technique is used for all elements of the sensors as well as for the field effect transistors 4 and the first electrodes 2 separately provided for each sensor. The semiconductor layer 5 which covers all first electrodes of the sensors and the electrically conductive layer 6 which serves as a common second electrode for all sensors of the matrix are also constructed in thin-film technology.

FIG. 2 illustrates that the structure of the matrix is comparatively simple because of the common layers 5 and 6, and that for each individual sensor it is merely necessary to provide a separate first electrode 2 and a field effect transistor 4. Because of this simple structure, such a matrix can be simply and inexpensively manufactured.

The second electrode 6 could be coarsely segmented without essentially making the manufacturing process more complex, i.e. a common, continuous layer could be provided for only a group of sensors. For example, for a group of 100 ×100 sensors a common counter-electrode 6 may be provided. The same holds for further groups of sensors which then comprise a respective, common second electrode layer 6. Such a group of sensors can be formed, for example by all sensors of a column or a row.

The semiconductor layer 5 is of a thickness so as to absorb a sufficient amount of radiation, e.g., X-ray radiation, such that no additional luminescent layer need be provided. The absorption of the X-rays initiates a charge shift to be measured. By way of example, layer 5 may be about 0.5 mm thick and comprises doped selenium. By way of further example, a common second electrode may be provided for a group of ten sensors.

Because a semiconductive layer 5 covers not only the sensor elements, but also the switching lines 8 for activating the switches, the read lines 10 and the switching transistors 4, such a configuration normally would be expected to fail using a thin film semiconductor layer 5, e.g. 1 $\mu$ a-Si. This is because the read lines 10 would be expected to act as sensors and the switching behavior of the transistors would tend to be influenced by the potential on the electrode 6. However, because a relatively thick semiconductor layer 5 is used (0.5 mm), the transistors 4 are influenced to a substantially lesser extent permitting the conductors of lines 8 and 10 to be juxtaposed with the semiconductor layer 5, as best seen in FIG. 2.

We claim:
1. A sensor matrix comprising:
a plurality of radiation sensitive sensors in a two dimensional matrix of columns and rows, each sensor comprising:
a first electrode;
a second electrode;
a semiconductor layer between the first and second electrodes;
the first electrodes of said sensors being separate from one another;
said semiconductor layer being continuous and common to said plurality of sensors, said layer covering and being contiguous with said first electrodes of said plurality of sensors;

said second electrodes being formed as a continuous layer for at least a group of sensors of said matrix and covering the semiconductive layer at the area of said first electrodes of said at least a group, the sensors of said at least a group lying in a two dimensional array of columns and rows;

a plurality of charge storage means for storing charges manifesting radiation incident on said semiconductor layer, each storage means being coupled to and corresponding to a different one of said first electrodes of said at least a group of sensors;

a plurality of thin-film electronic switches each coupled to and corresponding to a different one of said charge storage means and covered by said semiconductor layer; and means for selectively activating said switches for reading the charges of the storage means in a selected row;

said means for selectively activating including a plurality of thin-film switching conductors each coupled to the switches of a different corresponding row of said charge storage means and a plurality of thin-film read conductors coupled to said switches in a plurality of columns, each read conductor corresponding to a different column, said switches when activated causing the corresponding read conductors to carry the charges of the selected change storage means, said semiconductor layer being juxtaposed with said switching and read conductors.

2. A sensor matrix as claimed in claim 1 wherein the second electrode covers the semiconductor layer at the area of the first electrodes of a plurality of said at least a group of the sensors of the matrix and acts as a common second electrode for the sensors of said plurality of at least a group of the matrix.

3. A sensor matrix as claimed in claim 1 wherein the semiconductor layer common to all sensors is constructed to be sufficiently thick such that the semiconductor layer absorbs a sufficient amount of X-rays such that no additional luminescent layer is needed.

4. A sensor matrix as claimed in claim 3 wherein doped selenium is used as the semiconductor material, the semiconductor layer having a thickness of approximately 0.5 mm.

5. The sensor matrix of claim 1 including means for simultaneously reading the sensors of a row of said at least a group of sensors.

6. The sensor matrix of claim 1 including control means for simultaneously reading the sensors in a selected row of said at least a group of sensors and multiplex means for combining the signals read from the sensors of the selected row into a serial output signal.

7. The sensor matrix of claim 1 wherein said switches are field effect transistors.

8. The sensor matrix of claim 7 wherein said transistors have gate, drain and source terminals, said matrix further including switch means for selectively activating the gate terminals of a selected row of sensors of said at least a group, and read means for receiving signals read from the sensors, the read means including a plurality of read lines each read line coupled to the drain terminals of a different set of sensors to form a corresponding column, each column comprising a sensor from a different row, said source terminals being coupled to said first electrodes.

* * * * *